United States Patent
Brugger et al.

(10) Patent No.: US 9,093,482 B2
(45) Date of Patent: Jul. 28, 2015

(54) METHOD AND APPARATUS FOR LIQUID TREATMENT OF WAFER SHAPED ARTICLES

(71) Applicant: LAM RESEARCH AG, Villach (AT)

(72) Inventors: Michael Brugger, Millstatt (AT); Otto Lach, Treffen (AT); Olivier Postel, Riegesdorf (AT)

(73) Assignee: LAM RESEARCH AG, Villach (AT)

( * ) Notice: Subject to any disclaimer, the term of this patent is extended or adjusted under 35 U.S.C. 154(b) by 357 days.

(21) Appl. No.: 13/650,916

(22) Filed: Oct. 12, 2012

(65) Prior Publication Data

US 2014/0102637 A1 Apr. 17, 2014

(51) Int. Cl.
*H01L 21/67* (2006.01)
*H01L 21/687* (2006.01)

(52) U.S. Cl.
CPC .... *H01L 21/67051* (2013.01); *H01L 21/67028* (2013.01); *H01L 21/67109* (2013.01); *H01L 21/67115* (2013.01); *H01L 21/68785* (2013.01)

(58) Field of Classification Search
None
See application file for complete search history.

(56) References Cited

U.S. PATENT DOCUMENTS

| | | | |
|---|---|---|---|
| 4,903,717 A | 2/1990 | Sumnitsch | |
| 5,859,408 A * | 1/1999 | Baxendine | 219/390 |
| 5,882,433 A | 3/1999 | Ueno | |
| 5,965,047 A * | 10/1999 | Blersch et al. | 219/390 |
| 6,198,074 B1 * | 3/2001 | Savas | 219/390 |
| 6,536,454 B2 | 3/2003 | Lindner | |
| 7,509,035 B2 * | 3/2009 | Ranish et al. | 392/416 |
| 7,837,803 B2 | 11/2010 | Hohenwarter | |
| 7,891,314 B2 | 2/2011 | Pichler | |
| 2007/0113872 A1 * | 5/2007 | Uchida et al. | 134/26 |
| 2010/0055314 A1 * | 3/2010 | Kato et al. | 427/255.28 |
| 2010/0200163 A1 | 8/2010 | Puggl et al. | |
| 2010/0236579 A1 * | 9/2010 | Araki et al. | 134/26 |
| 2011/0151675 A1 | 6/2011 | Frank et al. | |
| 2012/0085372 A1 | 4/2012 | Plihon | |
| 2012/0103371 A1 | 5/2012 | Yun et al. | |
| 2012/0298149 A1 * | 11/2012 | Puggl | 134/33 |
| 2013/0048607 A1 * | 2/2013 | Matsushita et al. | 216/83 |
| 2013/0061805 A1 * | 3/2013 | Jin et al. | 118/725 |
| 2013/0061873 A1 * | 3/2013 | Hohenwarter et al. | 134/1.3 |

(Continued)

FOREIGN PATENT DOCUMENTS

EP 1791161 A2 * 5/2007 ............. H01L 21/00
WO 2004/084278 9/2004

(Continued)

OTHER PUBLICATIONS

U.S. Appl. No. 13/229,097, filed Sep. 9, 2011 (no U.S. publication number assigned yet).
U.S. Appl. No. 13/593,264, filed Aug. 23, 2012. (no U.S. publication number assigned yet).

*Primary Examiner* — Joseph M Pelham
(74) *Attorney, Agent, or Firm* — Young & Thompson

(57) ABSTRACT

In an apparatus and process for treating wafer-shaped articles, a spin chuck holds a wafer-shaped article in a predetermined orientation relative to an upper surface of the spin chuck. A heating assembly comprises a housing containing at least one infrared heating element. The heating assembly is mounted above the upper surface of the spin chuck and adjacent a wafer-shaped article when mounted on the spin chuck. The housing also contains a conduit having an inlet connected to a source of cooling fluid and an outlet returning cooling fluid to the source of cooling fluid.

14 Claims, 4 Drawing Sheets

(56) References Cited

U.S. PATENT DOCUMENTS

2013/0319472 A1* 12/2013 Frank et al. .................... 134/30
2014/0041803 A1* 2/2014 Koshizawa et al. ...... 156/345.19
2014/0097580 A1* 4/2014 Lach et al. .................... 279/123
2014/0102637 A1* 4/2014 Brugger et al. .......... 156/345.23

FOREIGN PATENT DOCUMENTS

| WO | 2006/008236 | 1/2006 |
| WO | 2009/010394 | 1/2009 |
| WO | 2011/007287 | 1/2011 |

* cited by examiner

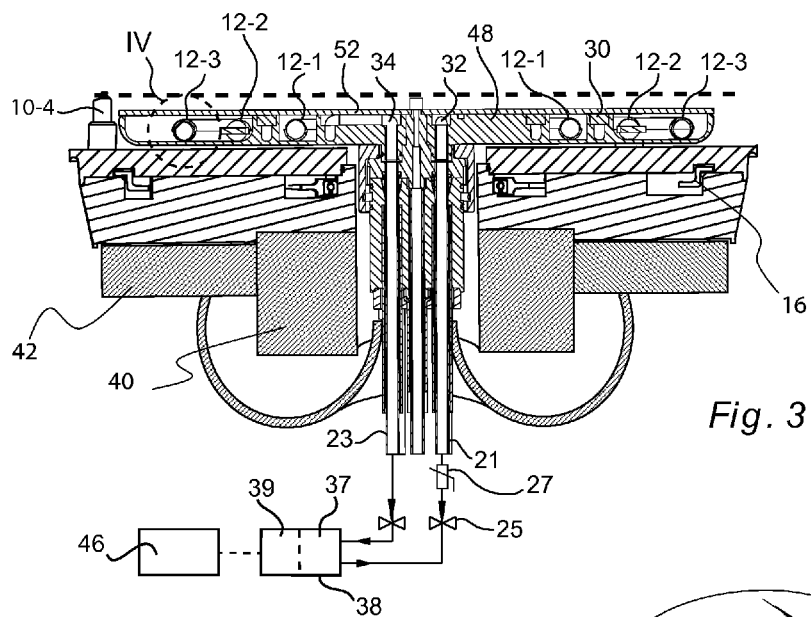
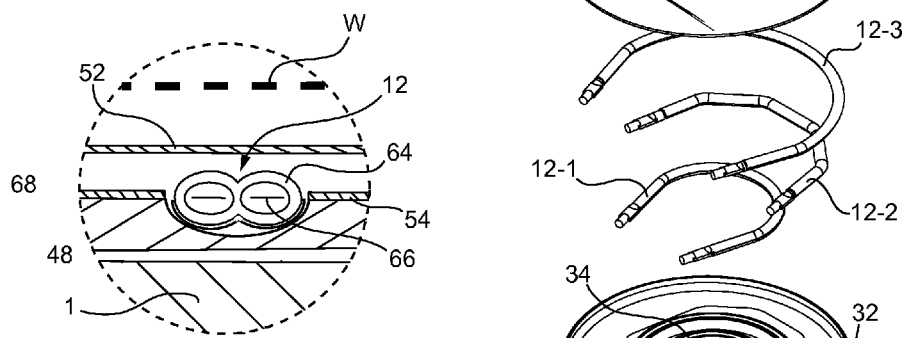
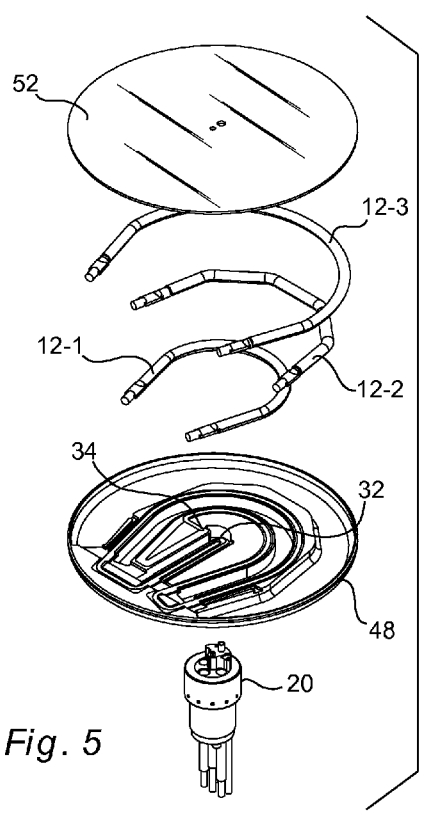
Fig. 3
Fig. 4
Fig. 5

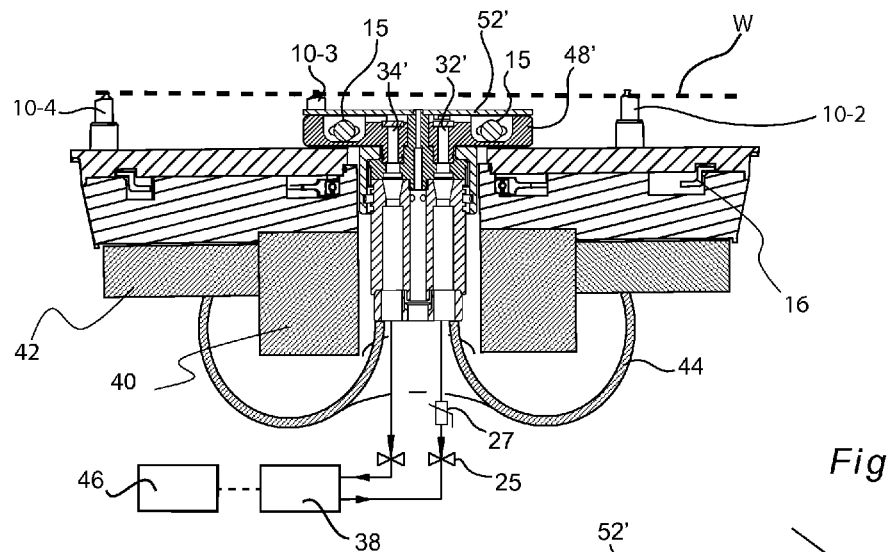
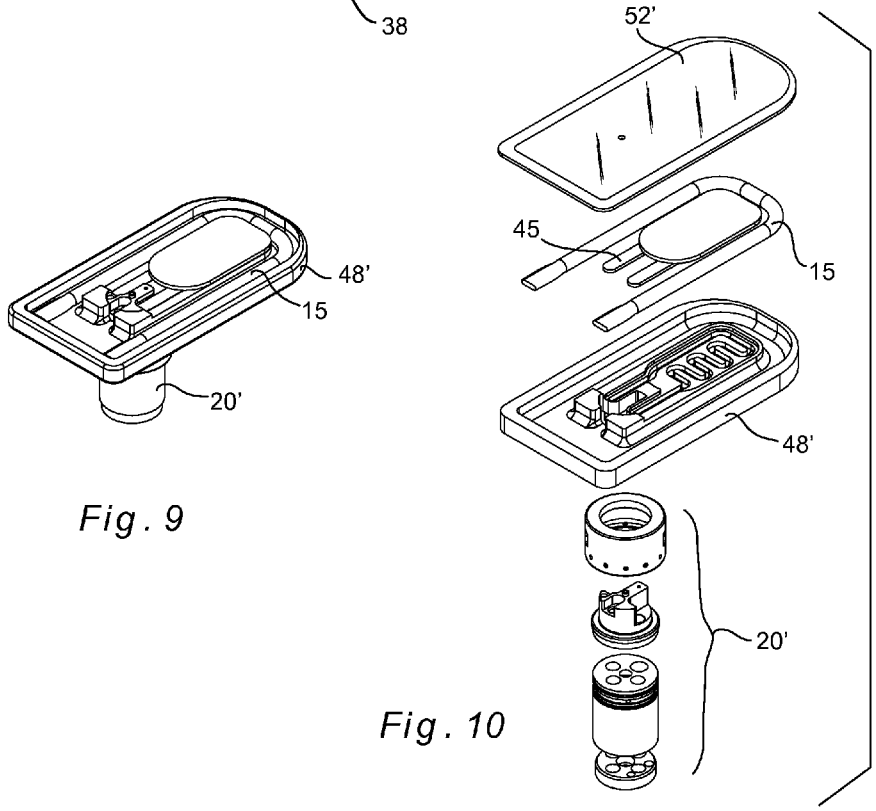
Fig. 8
Fig. 9
Fig. 10

METHOD AND APPARATUS FOR LIQUID TREATMENT OF WAFER SHAPED ARTICLES

BACKGROUND OF THE INVENTION

1. Field of the Invention

The invention relates to a method and apparatus for liquid treatment of wafer-shaped articles.

2. Description of Related Art

Liquid treatment includes both wet etching and wet cleaning, wherein the surface area of a wafer to be treated is wetted with a treatment liquid and a layer of the wafer is thereby removed or impurities are thereby carried off. A device for liquid treatment is described in U.S. Pat. No. 4,903,717. In this device the distribution of the liquid may be assisted by the rotational motion imparted to the wafer.

Techniques for drying a surface of a disc-shaped article are typically used in the semiconductor industry after cleaning a silicon wafer during production processes (e.g. pre-photo clean, post CMP-cleaning, and post plasma cleaning). However, such drying methods may be applied for other plate-like articles such as compact discs, photo masks, reticles, magnetic discs or flat panel displays. When used in semiconductor industry it may also be applied for glass substrates (e.g. in silicon-on-insulator processes), III-V substrates (e.g. GaAs) or any other substrate or carrier used for producing integrated circuits.

Various drying methods are known in the semiconductor industry, some of which utilize isopropyl alcohol to reduce surface tension of rinse water on a semiconductor wafer surface. See, e.g., U.S. Pat. No. 5,882,433. Improvements upon such methods, involving the use of heated isopropyl alcohol, are described in commonly-owned patent applications WO 2011/007287 and U.S. Ser. No. 12/914,802 (filed Oct. 28, 2010).

There remains a need, however, to develop improved methods for preventing pattern collapse in the submicroscopic structures formed on such semiconductor wafers, not only during such drying process but also during other liquid treatments. Pattern collapse can occur when the surface tension of a liquid moving radially outwardly across the surface of a rotating wafer applies a damaging or destructive force to the submicroscopic structures formed on the wafer surface.

The problem of pattern collapse becomes more serious as the diameter of semiconductor wafers increases. For example, the current generation of single wafer wet processing technology is designed for 300 mm diameter wafers, but the previous generation technology was designed for 200 mm wafers and a next generation may be designed for wafers of 450 mm or larger diameter.

In particular, as the wafer diameter increases, so too will the temperature differential between a liquid at the point where it is applied in a central region of the wafer and the same liquid after it has travelled radially outwardly to the periphery of the wafer.

The problem of pattern collapse also becomes more serious as the aspect ratio of the submicroscopic structures continues to increase. This is also an ongoing trend in the manufacture of semiconductor devices, as the pressure to reduce device dimensions in general applies more to the horizontal layout and less to the thickness direction.

Commonly-owned copending application Ser. No. 13/229,097, filed Sep. 9, 2011, describes a spin chuck with an infrared heater mounted stationarily between an upper surface of the rotating chuck and a lower surface of the rotating wafer held thereby.

Commonly-owned copending application Ser. No. 13/593,264, filed Aug. 23, 2012, describes such a spin chuck, in which an IR heater is provided with a gas inlet and exhaust to cool the heater and help control wafer-to-wafer processing consistency.

While these chucks provide improved wafer heating, a need has been identified to further improve the consistency of the system performance from one wafer to the next.

SUMMARY OF THE INVENTION

Thus, in one aspect, the present invention relates to an apparatus for treating a wafer-shaped article, comprising a spin chuck for holding a wafer-shaped article in a predetermined orientation relative to an upper surface of the spin chuck, and a heating assembly comprising a housing containing at least one infrared heating element. The heating assembly is mounted above the upper surface of the spin chuck and adjacent a wafer-shaped article when mounted on the spin chuck, wherein the housing also contains a conduit having an inlet connected to a source of cooling fluid and an outlet returning cooling fluid to the source of cooling fluid.

In preferred embodiments of the apparatus according to the present invention, the source of cooling fluid comprises a pump and a cooling section for removing heat from the cooling fluid.

In preferred embodiments of the apparatus according to the present invention, the heating assembly is mounted underlying a wafer-shaped article when mounted on the spin chuck, the heating assembly being stationary in relation to rotation of the spin chuck.

In preferred embodiments of the apparatus according to the present invention, the outlet and the inlet of the conduit are positioned in a central region of the spin chuck, and an intermediate portion of the conduit is positioned in a peripheral region of the spin chuck.

In preferred embodiments of the apparatus according to the present invention, the spin chuck comprises a rotary chuck body and a stationary hollow shaft passing through a central opening of the rotary chuck body, and an upper end of the stationary hollow shaft carries the heating assembly.

In preferred embodiments of the apparatus according to the present invention, the housing further comprises a gas inlet connected to a gas supply, and at least one outlet for discharging gas from the housing.

In preferred embodiments of the apparatus according to the present invention, a temperature sensor is positioned so as to sense a temperature of heated cooling fluid passing through the conduit and a flow controller adjusts a flow of cooling fluid to the inlet based upon a temperature detected by the temperature sensor.

In preferred embodiments of the apparatus according to the present invention, the heating assembly comprises at least two infrared heating elements, the at least two infrared heating elements being arranged in a nested configuration surrounding an axis of rotation of the spin chuck.

In preferred embodiments of the apparatus according to the present invention, each of the at least two infrared heating elements is individually controllable, thereby to enable generating at least two heating zones across a surface of the spin chuck having heating profiles that differ from one another.

In preferred embodiments of the apparatus according to the present invention, the conduit extends within the housing along a serpentine path whose length is at least twice a maximum length of the housing.

In preferred embodiments of the apparatus according to the present invention, the at least one infrared heating element is generally U-shaped, and extends from a central region of the spin chuck to a peripheral region of the spin chuck.

In preferred embodiments of the apparatus according to the present invention, the conduit extends along a serpentine path between branches of the generally U-shaped infrared heating element.

In preferred embodiments of the apparatus according to the present invention, the housing also contains a second conduit having an inlet connected to a source of cooling gas and an outlet not returning the cooling gas to the source of cooling gas, but ejecting the cooling gas into the volume between the wafer-shaped article and the spin chuck. The gas may eject radially, or towards the wafer-shaped article, or towards the spin chuck, or a combination thereof.

In preferred embodiments of the apparatus according to the present invention, the spin chuck is a tool within a process module for single wafer wet processing of semiconductor wafers.

In preferred embodiments of the apparatus according to the present invention, the housing comprises a cover having at least one opening through which passes a nozzle for dispensing a fluid onto an underside of a wafer-shaped article when mounted on the spin chuck.

In preferred embodiments of the apparatus according to the present invention, the spin chuck comprises a circular series of gripping pins adapted to engage an edge region of a wafer-shaped article when mounted on the spin chuck. Each of the gripping pins comprises a distal end projecting upwardly beyond an uppermost surface of the housing.

BRIEF DESCRIPTION OF THE DRAWINGS

Other objects, features and advantages of the invention will become more apparent after reading the following detailed description of preferred embodiments of the invention, given with reference to the accompanying drawings, in which:

FIG. 3 is a partial axial section through the chuck depicted in FIG. 1, taken along the line III-III of FIG. 1, with a wafer in position as indicated in broken line;

FIG. 4 is an enlarged view of the detail IV designated in FIG. 3;

FIG. 5 is an exploded view of the components forming the heating assembly and the stationary hollow nozzle of the embodiment of FIG. 1;

FIG. 8 is a partial axial section through the chuck depicted in FIG. 6, taken along the line VIII-VIII of FIG. 6, with a wafer in position as indicated in broken line;

FIG. 9 is a perspective view of the components forming the heating assembly and the stationary hollow nozzle of the embodiment of FIG. 6; and FIG. 10 is an exploded view of the components forming the heating assembly and the stationary hollow nozzle of the embodiment of FIG. 6.

DETAILED DESCRIPTION OF PREFERRED EMBODIMENTS

Figure 1:
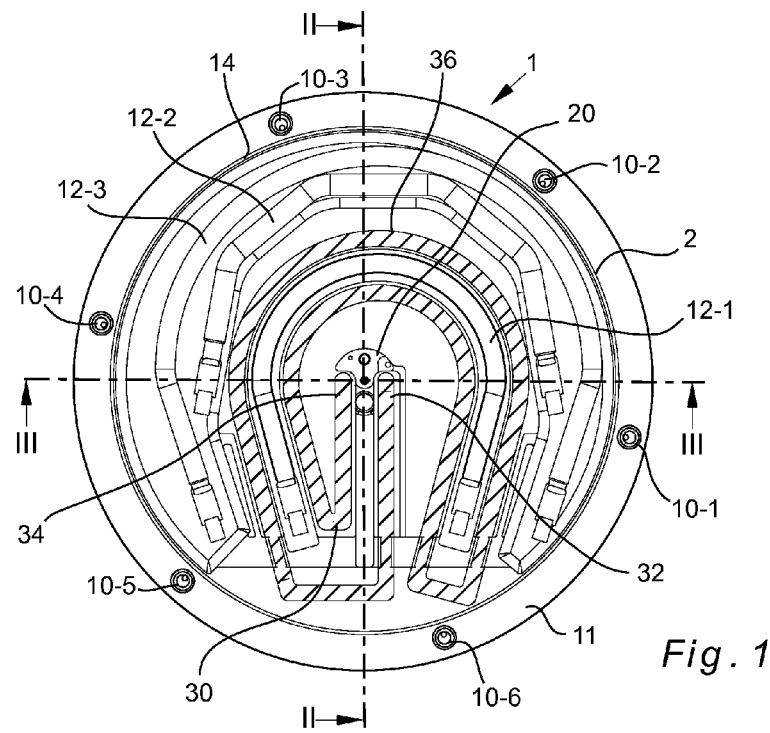
FIG. 1 is a top plan view of a chuck according to a first embodiment of the invention.

Referring now to the drawings, FIGS. 1-5 depict a first embodiment of a spin chuck 1 that holds a wafer W thereon in a predetermined orientation, which is preferably such that the major surfaces are disposed horizontally or within +20° of horizontal. Spin chuck 1 may for example be a chuck as described in commonly-owned U.S. Pat. No. 6,536,454 and in commonly-owned copending application U.S. Pub. No. 2010/0200163.

Chuck 1 includes a series of gripping pins, which in this embodiment are six in number, designated 10-1 through 10-6. Gripping pins 10-1 to 10-6 prevent the wafer from sliding laterally off the chuck. In this embodiment, the upper portions of gripping pins 10-1 to 10-6 also provide subjacent support for wafer W, and thus the chuck need not operate according to the Bernoulli principle and need not be adapted to supply a gas cushion beneath wafer. In particular, each gripping pin 10-1 to 10-6 comprises an uppermost gripping portion that extends vertically from the cylindrical pin base, generally along an axis that is offset in relation to the rotation axis of the cylindrical pin base. The upper gripping portions furthermore each comprise a lateral recess or cut-out that is designed to accommodate the peripheral edge of a wafer, as is described in greater detail below.

Although not shown in the figures, the spin chuck may be surrounded by a process chamber, which may be a multi-level process chamber as described in commonly-owned U.S. Pat. No. 7,837,803 (corresponding to WO 2004/084278). The spin chuck can be positioned at the selected level by moving the chuck axially relative to the stationary surrounding chamber, or by moving the surrounding chamber axially relative to the axially-stationary chuck, as described in connection with FIG. 4 of U.S. Pat. No. 6,536,454 or US 2010/0200163.

Chuck 1 furthermore comprises a heating assembly 2 for heating the underside of a wafer mounted on the chuck. Heating assembly 2 is integrated with a stationary hollow nozzle head 20 that supplies fluids to the downwardly-facing side of the wafer W.

Heating assembly 2 in this embodiment comprises three curved infrared heating elements 12-1, 12-2 and 12-3, which are arranged generally concentrically to one another as well as to the axis of rotation of the spin chuck 1. In this embodiment, infrared heating elements 12-2 and 12-3 are controlled separately from infrared heating element 12-1, which permits creating two heating zones across the surface of the spin chuck 1. The temperature in each zone can thereby be individually controlled, as well as the time window during which heating is applied to the wafer.

The heating elements 12-1, 12-2 and 12-3 are received in a housing 14 which is of generally circular shape. As is described hereinbelow, because heating assembly 2 remains stationary relative to the rotating chuck 1 and the rotating wafer W, the circumferential distribution of the heating elements may be neglected when designing the heating assembly, with the available heating power across the radius of the wafer being the principal design consideration.

Heating elements 12-1, 12-2 and 12-3 may be replaced by a lesser or greater number of heating elements, and it is also within the scope of the invention to provide only a single infrared heating element within the housing 14.

Housing 14 is integrated with the stationary nozzle 20 that forms the dispensing assembly and cooling fluid distribution manifold of this embodiment. As shown in greater detail in FIG. 2, the dispensing assembly comprises a non-rotating (stationary) nozzle head 20 whose nozzles 22, 24 penetrate the cover of the heating assembly, as described below. In this embodiment, nozzles 22 and 24 open above housing 14, that is, the associated conduits and nozzles 22, 24 pass entirely through housing 14 but do not open into the housing 14. These conduits may supply for example deionized water and dry nitrogen gas, respectively, to the underside surface of the wafer W. Conduit 26, on the other hand, leads to an inlet or a group of inlets that open into the interior of housing 14, and supplies gas such as nitrogen that is utilized for cooling the heating elements 12.

Nozzle 24 is centrally arranged and is connected to a gas source. Gas such as nitrogen or ultra clean air is led through the associated conduit and nozzle 24 and onto the downwardly-facing surface of the wafer. Nozzle 24 may also supply nitrogen or ultra clean air as a purge gas to the space 31 between the underside of wafer W and the upper surface of heater assembly 12.

Figure 2:
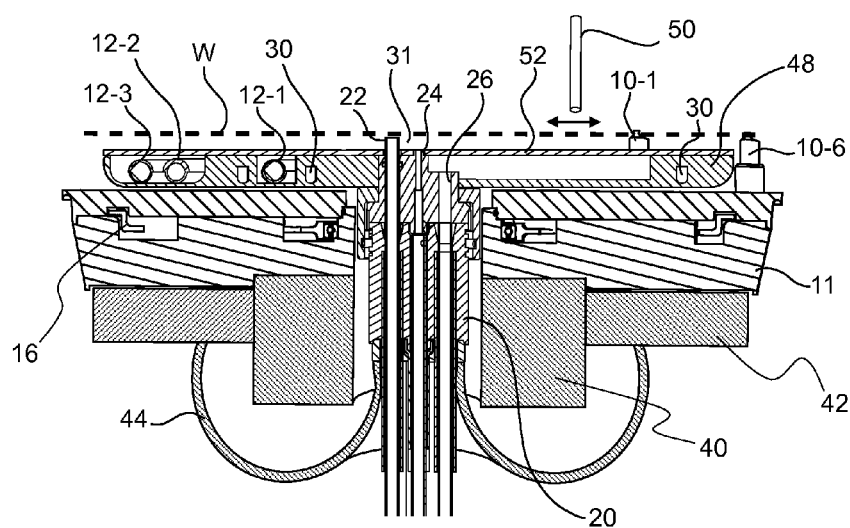
FIG. 2 is a partial axial section through the chuck depicted in FIG. 1, taken along the line II-II of FIG. 1, with a wafer in position as indicated in broken line.
Figure 6:
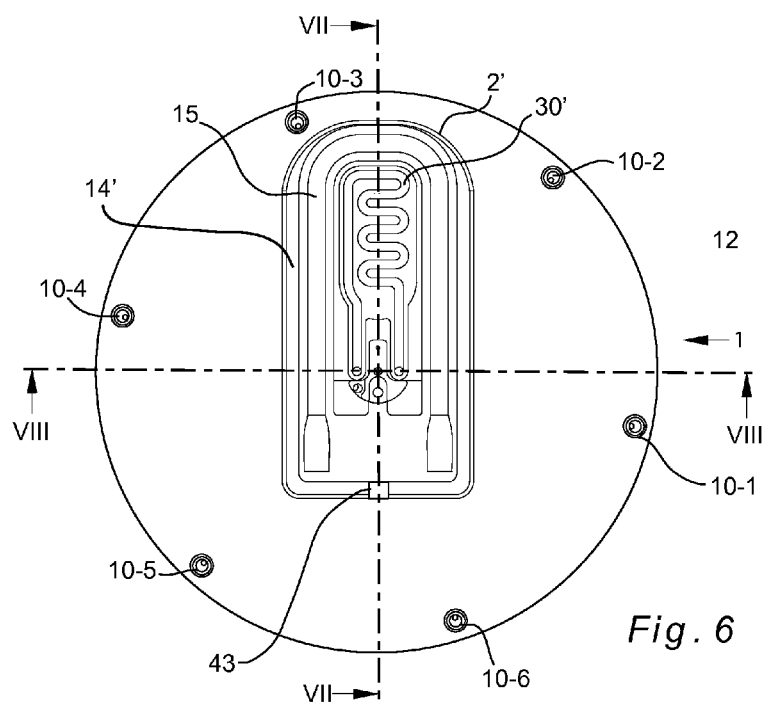
FIG. 6 is a top plan view of a chuck according to a second embodiment of the invention.
Figure 7:
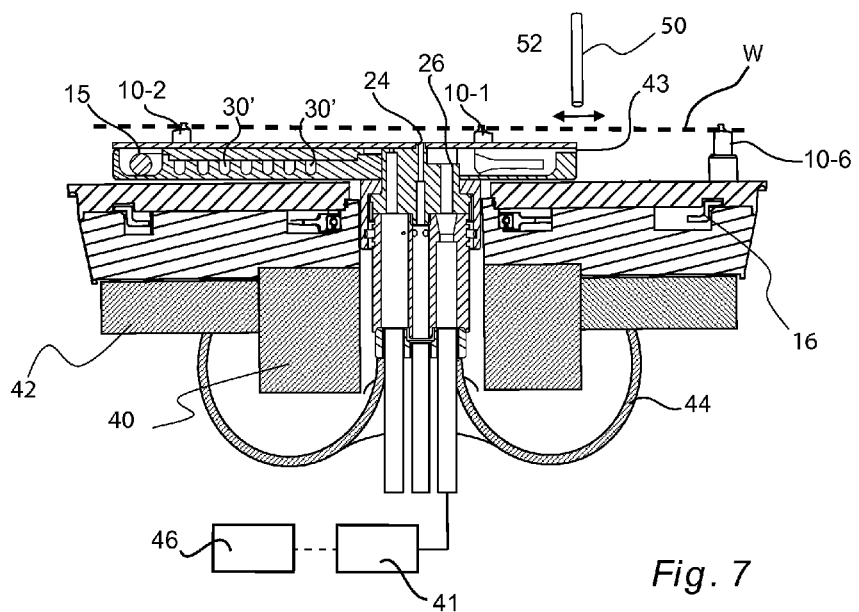
FIG. 7 is a partial axial section through the chuck depicted in FIG. 6, taken along the line VII-VII of FIG. 6, with a wafer in position as indicated in broken line.

FIG. 2 also shows that the heating assembly 2 is mounted in a cantilever fashion such that it is spaced from both the overlying wafer W as well as from the rotating upper surface of chuck 1. Housing 14 is therefore rigid enough that it does not contact either the rotating surfaces of the chuck or the wafer. Although the housing 14 of this embodiment comprises a circular peripheral portion that extends along the whole circumference of the chuck 1, it is also contemplated to configure the housing so that is covers only about half, or even a third or less, of the area of the spin chuck 1 within the circle defined by the gripping pins 10-1 through 10-6.

The spin chuck has a base body 10, which is mounted onto a rotor 40, which is part of a hollow shaft motor. The hollow shaft motor includes rotor 40 and stator 42. The stator 42 is connected to a machine frame 44. The cylinder-like non-rotating nozzle head 20 is connected stationarily to the machine frame 44. The stationary nozzle head 20 penetrates through a central opening of the spin chuck 1.

The housing 14 of heating assembly 2 furthermore includes a closed loop conduit 30 through which a cooling fluid is circulated. Although shown in plan view, cross-hatching has been applied to conduit 30 in FIG. 1 for ease of identification. Conduit 30 originates at an inlet 32 and terminates at an outlet 34. In between, it follows a serpentine path along two loops that are generally concentric with the heating elements 12-1, 12-2 and 12-3. The intermediate portions 36 of these loops are located in a more peripheral region of the spin chuck 1, whereas the inlet 32 and outlet 34 are in a more central region.

As shown in FIG. 3, inlet 32 and outlet 34 of conduit 30 are connected to a supply 38 of cooling fluid, which is preferably a liquid. Examples of suitable cooling liquids include chilled water, calcium chloride brine, sodium chloride brine, alcohol, and similar nonfreezing solutions with a high boiling point such as mixtures of diethylene glycol and deionized water. Alternatively, the cooling fluid may be a refrigerant that cools by phase change, and in particular by boiling, to remove heat from the interior of housing 14 as the latent heat of vaporization of the liquid.

The supply 38 of cooling fluid includes a pump 37 and a cooling section 39 for removing heat from the cooling fluid. The operation of supply 38 is controlled by a computer-based microcontroller 46, which preferably also controls all operations of the spin chuck 1 as well as plural additional such spin chucks as will typically be present in a process module for single wafer wet processing of semiconductor wafers.

Conduits 21 and 23 lead to inlet 32 and outlet 34, respectively, from cooling supply 38. Valves 25 are preferably mounted in one or both of these conduits 21, 23, to regulate the flow of cooling fluid through conduit 30. Furthermore, a temperature sensor 27 may be positioned in the outlet conduit 27 and/or internally of the housing 14. The readout of these sensors is supplied to the microcontroller 46, which then adjusts the valve(s) 25 and/or the thermostat setting of the cooling section 39, to maintain the operating temperatures within desired limits.

The closed loop cooling system as described above more effectively cools down the infrared heating elements between heating processes, and can also regulate the quantity of heat applied to a wafer during a heating process. These attributes improve process performance on a given wafer, and also, importantly, contribute significantly to the uniformity of processing results from one wafer to the next.

The main body 48 and cover 52 of housing 14 are preferably formed of a material that is substantially transparent to the wavelengths of radiation emitted by the IR heating elements 12-1, 12-2, 12-3, with a preferred material for these housing components being quartz glass. Preferably, cover 52 forms a liquid-tight seal with housing body 48, other than where outlets 36 are formed, so as to exclude process liquids such as hot isopropyl alcohol from the housing 14 where they might otherwise contact heating elements 12-1, 12-2, 12-3.

In the detail of FIG. 4, it can be seen that the wafer W is positioned above the upper surface of the heating assembly 2. On the other hand, the lower surface of the heating assembly 2 is spaced from the upper surface of the chuck 1 by the gap 32. Thus, as the chuck 1 and wafer W are rotated in unison, the heating assembly 2, whose housing 14 is integrated with the stationary nozzle 20, remains stationary.

Heating elements 12-1, 12-2, 12-3 in this embodiment preferably take the form of a twin wall quartz tube 64, each of which contains a pair of tungsten heating coils 66 sealed inside the twin wall quartz tube 64, in an ambient of argon gas. Heating elements 12-1, 12-2, 12-3 furthermore preferably comprise a coating or layer 68 on their lower half, which is a material that is reflective of the infrared radiation generated by the heating element 12. Such a coating 68 may for example be a metal, such as gold, or a non-metal, such as a film of opaque synthetic quartz material.

Heating elements 12-1, 12-2, 12-3 in this embodiment preferably emit infrared radiation with a maximum peak at 1000 nm+/−300 nm. Those wavelengths correspond to the region of high absorption by silicon, which will often be the material of a wafer to be treated in the present apparatus. Preferably, the infrared heater is selected and operated so that an IR-spectrum is emitted, and so that the silicon of a silicon wafer absorbs at least 50% of the IR-radiation.

Interior surfaces of the housing 14 that face upwardly are preferably coated with a quartz reflective coating 54. Coating 54 is a material that is reflective of the infrared radiation generated by the heating elements 12-1, 12-2, 12-3. Such a coating 54 may for example be a metal, such as gold, or a non-metal, such as a film of opaque synthetic quartz material.

Gripping elements 10-1 to 10-6 are provided with eccentrically mounted grippers. The gripping elements are conjointly rotated about their cylindrical axes by a tooth gear 16 that is in meshing engaging with all of the gripping elements. The eccentric grippers are thus moved in concert between a radially inner closed position in which a wafer W is secured, to a radially outer open position in which the wafer W is released. Gripping elements 10-1 to 10-6 can be made as described in commonly-owned U.S. application Ser. No. 12/668,940 (corresponding to WO 2009/010394, or as described in commonly-owned U.S. application Ser. No. 12/642,117, filed Dec. 18, 2009). Gripping elements 10-1 to 10-6 thus comprise an eccentric uppermost portion that contacts wafer W, projecting from a base that is mounted for pivotal movement about its central axis. In particular, a ring gear 16 is centered on the underside of the chuck upper body, and simultaneously engages via its peripheral gear teeth with gear teeth formed on the base of each of the pins 10-1 to 10-6.

Pins 10-1 to 10-6 are evenly distributed about the periphery of spin chuck 1, with at least three and preferably six such pins 10 being provided.

An optional upper liquid dispenser 50 supplies treatment liquid from above, and can incorporate a plurality of different liquid dispensing nozzles for dispensing a variety of different treatment liquids, as described for example in commonly-owned U.S. Pat. No. 7,891,314 (corresponding to WO 2006/008236). Upper liquid dispenser 50 is preferably displaceable radially of the wafer W, to aid in spreading treatment liquid over the entire upwardly facing surface of wafer W as it is rotated on the spin chuck.

In FIGS. 6-10, a second embodiment of the apparatus according to the invention includes numerous components that are as described in connection with the first embodiment, and which are designated with like reference numerals.

The infrared heating assembly 2' of this embodiment includes only a single U-shaped infrared heating element 15. The conduit 30' for the cooling fluid follows a serpentine path between the branches of the U-shaped heating element 15.

The cover 52' of this embodiment has only a single hole to accommodate passage of a nozzle 24 as described in connection with the first embodiment. Nozzle 26 in this embodiment opens into an interior cavity with housing 14', and is supplied with a cooling gas from a gas supply 41 under control of microprocessor 46. Housing 14' includes an exhaust opening 43 to discharge heated gas from the interior of housing 14' to the ambient, in the region between the chuck 1 and the wafer W. Opening 43 in this embodiment directs exhaust gas parallel to the opposing surfaces of the chuck 1 and wafer W; however, the opening may also be provided in an upwardly facing surface of housing 14' so as to direct exhaust gas axially upwardly onto the downwardly-facing surface of a wafer W when positioned in the chuck 1.

In the perspective view of FIG. 9, the cover 52' is removed for ease of understanding. In comparing FIGS. 9 and 10, it will be evident that the housing 14' of this embodiment has a serpentine groove formed in the main body 48', which is closed by a covering member 45 that integrated with the heating element 15, to define the conduit 30'.

In the following a process for treating the wafer W shall be described. A wafer W, for example a 300 mm silicon wafer, is placed on the spin chuck 1 of FIGS. 1-5, and securely held by gripping elements 10-1 to 10-6. The spin chuck is rotated at a spin speed of, for example, 500 rpm. A drying liquid comprising heated isopropyl alcohol is supplied to the center of the wafer upper surface at volume flow of 1500 ml/min through nozzle 50. Simultaneously the infrared heating assembly 2 is activated so as to heat the wafer to a desired temperature.

After the target temperature is reached, the infrared heating element 12 is switched off and chilled water is supplied from supply 38 under the control of microcontroller 46. When the temperature sensor 27 detects that the housing interior has been cooled to a predetermined temperature, microcontroller 46 terminates or substantially reduces flow of coolant fluid to the conduit 30.

The apparatus according to this embodiment is preferably utilized over a wafer heating temperature range of 50-100° C., which corresponds to a heating energy range of 2-4 kW for preferred infrared heating elements. In relation to the above-referenced commonly-owned applications, wafer to wafer drift is further reduced and repeat accuracy, wafer temperature uniformity, and wafer heating and cooling times are further improved.

While the present invention has been described in connection with various preferred embodiments thereof, it is to be understood that those embodiments are provided merely to illustrate the invention, and should not be used as a pretext to limit the scope of protection conferred by the true scope and spirit of the appended claims.

What is claimed is:

1. Apparatus for treating a wafer-shaped article, comprising:
   a spin chuck for holding a wafer-shaped article in a predetermined orientation relative to an upper surface of the spin chuck; and
   a heating assembly comprising a housing containing at least one infrared heating element, said heating assembly being mounted above said upper surface of said spin chuck and adjacent a wafer-shaped article when mounted on the spin chuck, wherein said housing also contains a conduit having an inlet connected to a source of cooling fluid and an outlet returning cooling fluid to the source of cooling fluid;
   wherein said housing comprises a cover having at least one opening through which passes a nozzle for dispensing a fluid onto an underside of a wafer-shaped article when mounted on said spin chuck.

2. The apparatus according to claim 1, wherein said source of cooling fluid comprises a pump and a cooling section for removing heat from the cooling fluid.

3. The apparatus according to claim 1, wherein said heating assembly is mounted underlying a wafer-shaped article when mounted on the spin chuck, the heating assembly being stationary in relation to rotation of said spin chuck.

4. The apparatus according to claim 1, wherein said outlet and said inlet of said conduit are positioned in a central region of said spin chuck, and wherein an intermediate portion of said conduit is positioned in a peripheral region of said spin chuck.

5. The apparatus according to claim 1, wherein said spin chuck comprises a rotary chuck body and a stationary hollow shaft passing through a central opening of said rotary chuck body, and wherein an upper end of said stationary hollow shaft carries said heating assembly.

6. The apparatus according to claim 1, wherein said housing further comprises a gas inlet connected to a gas supply, and at least one outlet for discharging gas from said housing.

7. The apparatus according to claim 1, further comprising a temperature sensor positioned so as to sense a temperature of heated cooling fluid passing through said conduit and a flow controller that adjusts a flow of cooling fluid to said inlet based upon a temperature detected by said temperature sensor.

8. The apparatus according to claim 1, wherein said heating assembly comprises at least two infrared heating elements, said at least two infrared heating elements being arranged in a generally concentric configuration surrounding an axis of rotation of said spin chuck.

9. The apparatus according to claim 8, wherein each of said at least two infrared heating elements is individually controllable, thereby to enable generating at least two heating zones across a surface of said spin chuck having heating profiles that differ from one another.

10. The apparatus according to claim 1, wherein said conduit extends within said housing along a serpentine path whose length is at least twice a maximum length of said housing.

11. The apparatus according to claim 1, wherein said at least one infrared heating element is generally U-shaped, and extends from a central region of said spin chuck to a peripheral region of said spin chuck.

12. The apparatus according to claim 1, wherein said housing further comprises a second inlet connected to a source of cooling gas and a second outlet exhausting the cooling gas into a volume between the wafer-shaped article and the spin chuck.

13. The apparatus according to claim 1, wherein the source of cooling fluid is a source of cooling liquid.

14. The apparatus according to claim 1, wherein said spin chuck comprises a circular series of gripping pins adapted to engage an edge region of a wafer-shaped article when mounted on said spin chuck, and wherein each of said gripping pins comprises a distal end projecting upwardly beyond an uppermost surface of said housing.

* * * * *